(12) United States Patent
Zhu et al.

(10) Patent No.: US 10,974,971 B2
(45) Date of Patent: Apr. 13, 2021

(54) COMPOSITE MATERIAL DEVICE

(71) Applicant: Nanjing University, Nanjing (CN)

(72) Inventors: Jia Zhu, Nanjing (CN); Lin Zhou, Nanjing (CN); Yingling Tan, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 0 days.

(21) Appl. No.: 15/775,767

(22) PCT Filed: Nov. 11, 2016

(86) PCT No.: PCT/CN2016/105410
§ 371 (c)(1),
(2) Date: May 11, 2018

(87) PCT Pub. No.: WO2017/080495
PCT Pub. Date: May 18, 2017

(65) Prior Publication Data
US 2018/0346346 A1    Dec. 6, 2018

(30) Foreign Application Priority Data
Nov. 12, 2015  (CN) ..................... 201510770546.X

(51) Int. Cl.
*C02F 1/14* (2006.01)
*C23C 14/46* (2006.01)
(Continued)

(52) U.S. Cl.
CPC ............. *C02F 1/14* (2013.01); *C23C 14/18* (2013.01); *C23C 14/185* (2013.01); *C23C 14/30* (2013.01);
(Continued)

(58) Field of Classification Search
CPC ...... C02F 1/14; C02F 2103/08; C25D 11/045; C25D 11/04; C23C 14/46; C23C 14/30; C23C 14/185; C23C 14/18; Y10T 428/26
See application file for complete search history.

(56) References Cited

U.S. PATENT DOCUMENTS

2005/0170494 A1    8/2005  Mukai
2007/0165217 A1*   7/2007  Johansson ............ G01N 21/658
                                                     356/301
(Continued)

FOREIGN PATENT DOCUMENTS

CN    101950785 A    1/2011
CN    105442014 A    3/2016
(Continued)

OTHER PUBLICATIONS

[NPL-1] Wang et al. "NANO-Cu/Al2O3 Assemblies Template synthesis and optical absorption". Acta Physica Sinica, vol. 50, No. 9, Sep. 2001, pp. 1751-1755; (Google Translate—Machine Translation). (Year: 2001).*
(Continued)

*Primary Examiner* — David Sample
*Assistant Examiner* — Donald M Flores, Jr.
(74) *Attorney, Agent, or Firm* — Adeli LLP

(57) ABSTRACT

The disclosed is provided with a composite material device, comprising a substrate, a plurality of pores provided on the substrate, and a plurality of metal particles adhered onto inner walls of the pores, the metal particles having a particle size of from 1 to 200 nm, wherein the plurality of metal particles have at least x different particle sizes d. The composite material device of the present discloser has a high light absorption rate and a broad light absorption wavelength range.

21 Claims, 8 Drawing Sheets

(51) Int. Cl.
*C23C 14/30* (2006.01)
*C25D 11/04* (2006.01)
*C23C 14/18* (2006.01)
*C02F 103/08* (2006.01)

(52) U.S. Cl.
CPC .............. *C23C 14/46* (2013.01); *C25D 11/04* (2013.01); *C25D 11/045* (2013.01); *C02F 2103/08* (2013.01); *Y10T 428/26* (2015.01)

(56) References Cited

U.S. PATENT DOCUMENTS

| | | |
|---|---|---|
| 2007/0285657 A1 | 12/2007 | Wang et al. |
| 2009/0283424 A1* | 11/2009 | Carson ..................... B82Y 5/00 205/792 |
| 2014/0076600 A1 | 3/2014 | Browning et al. |
| 2017/0360717 A1* | 12/2017 | Desai ................... A61K 9/7007 |

FOREIGN PATENT DOCUMENTS

| | | |
|---|---|---|
| EP | 3375912 A1 | 9/2018 |
| JP | 2006083451 A | 3/2006 |

OTHER PUBLICATIONS

[NPL-2] Wang et al. "NANO-Cu/Al2O3 Assemblies Template synthesis and optical absorption". Acta Physica Sinica, vol. 50, No. 9, Sep. 2001, pp. 1751-1755. (Year: 2001).*

[NPL-3] Johansson et al. "Copper nanoparticles deposited inside the pores of anodized aluminum oxide using atomic layer deposition". Materials Science and Engineering C 23 (2003) pp. 823-826. (Year: 2003).*

[NPL-4] Lee et al. "Porous Anodic Aluminum Oxide: Anodization and Templated Synthesis of Functional Nanostructures"; Chem. Rev. 2014, 114, pp. 7487-7556. (Year: 2014).*

European Supplementary Search Report for Commonly Owned International Patent Application PCT/CN2016/105410, dated Jun. 26, 2019, 20 pages, European Patent Office.

Johansson, A., et al., "Copper Nanoparticles Deposited Inside the Pores of Anodized Aluminium Oxide Using Atomic Layer Deposition," Materials and Science Engineering, Nov. 7, 2003, 4 pages, vol. 23, No. 6-8, Elsevier B.V.

Napolskii, K.S., et al., "Templating of Electrodeposited Platinum Group Metals as a Tool to Control Catalytic Activity," Feb. 17, 2007, 10 pages, Elsevier Ltd.

Wang, Jie, et al., "Supporting Information for: Thin Porous Alumina Sheets as Supports for Stabilizing Gold Nanoparticles," ACS Nano 2013, May 20, 2013, 12 pages, vol. 7, No. 6, American Chemical Society.

Jo, Hanggochnuri, et al., "Novel Architecture of Plasmon Excitation Based on Self-Assembled Nanoparticle Arrays for Photovoltaics," ACS Applied Materials & Interfaces, Dec. 16, 2013, 6 pages, vol. 6, Issue 3, American Chemical Society, USA.

Nielsen, Peter, et al., "Fabrication of Large-Area Self-Organizing Gold Nanostructures with Sub-10 nm Gaps on aPorous Al2O3 Template for Application as a SERS-Substrate," The Journal of Physical Chemistry C, Jul. 2, 2009, 7 pages, vol. 113, Issue 32, American Chemical Society, USA.

Yin-Hai, Wang, et al., "NANO-Cu/Al2O3 Assemblies Template Synthesis and Optical Absorption," ACTA Physica Sinica/Chinese Physics, Sep. 2001, 5 pages, vol. 50, No. 9, IOP Science.

Armelao, Lidia, et al., "Recent Trends on Nanocomposites Based on Cu, Ag and Au Clusters: A Closer Look," Coordination Chemistry Reviews, Jan. 10, 2006, 21 pages, vol. 250, Elsevier B.V.

Extended European Search Report for Commonly Owned corresponding European Patent Application EP16863671.0, dated Oct. 18, 2019, 20 pages, European Patent Office.

* cited by examiner

COMPOSITE MATERIAL DEVICE

TECHNICAL FIELD

The disclosed relates to a composite Material field, and particularly to a composite material device.

BACKGROUND ART

Light absorbers are useful in a broad range of applications including light/thermal detection, solar energy conversion, and infrared imaging. The light absorbance of the light absorbers and the range of the absorption spectrum are essential factors for deciding the performances of the light absorbers. Ideal light absorbers have a high light absorbance rate in a broad wavelength range, and in other word, in the broad spectral range, the light absorbers have low light transmittance and low light reflectance.

There are many light absorbers, particularly nano-plasmonic absorbers, in the related art. For example, there are light absorbers having a metal meta-surface structure and light absorbers having a cone structure. The spectra of light that can be absorbed by the light absorbers are broadened, owing to a composite resonance mode. A plasmonic absorber based on a crossed trapezoid grating array can achieve an light absorption rate of 71% at a wavelength ranging from 400 to 700 nm. A metallic light absorber having an ultra-sharp convex metal grooves is demonstrated to have an absorption efficiency of 96% in light spectra ranging from 450 to 850 nm. In addition, refractory materials, for example titanium nitride or vanadium dioxide, are also applied in light absorbers.

Most light absorbers in the related art are fabricated by a top-down method such as a focused ion beam or an electron-beam lithography. However, high cost of these method limits the fabrication throughput of the light absorbers and reduces their possibility to be widely applied. Meanwhile, light absorbers in the related art further have the defects of a narrow absorption spectral range and a low light absorption rate.

Utilizing optical energy to directly evaporate sea water in order to achieve the desalination of sea water is a low-cost and environmentally friendly method. However, conventional devices and methods for desalinating sea water by evaporation have a series of deficiencies such as low energy conversion efficiency, low repeatability and high production costs.

BRIEF SUMMARY OF THE DISCLOSURE

In order to solve one or more problems in the related art, an objective of the disclosed is to provide a composite material device. A further objective of the disclosed is to provide a composite material device useful for light absorption. A further objective of the disclosed is to provide a composite material device having a high absorption efficiency. A further objective of the disclosed is to provide a composite material device have a broad light absorption wavelength range. A further objective of the disclosed is to provide a composite material device with low production cost. A further objective of the disclosed is to provide a composite material device that could be used for desalination of sea water. A further objective of the disclosed is to provide a composite material device having a high efficiency for desalination of sea water.

For these, a first aspect of the disclosed is to provide a composite material device, comprising a substrate comprising a plurality of pores, and a plurality of metal particles adhered onto the inner walls of the pores, the metal particles having a particle size of from 1 to 200 nm, and said plurality of metal particles have at least x different particle sizes d, x being larger than or equal to 2.

A second aspect of the disclosed is to provide a composite material device, comprising a substrate, a plurality of pores provided on the substrate, and a plurality of metal particles adhered onto inner walls of the pores, wherein the plurality of pores have at least z different pore diameters f, z being larger than or equal to 2.

A third aspect of the disclosed is to provide a method for producing any one of the composite material devices according to the disclosed embodiments, comprising depositing metal particles on a surface of the substrate and on the inner walls of the pores of the substrate by a physical vapor deposition process, wherein the parameters of the physical vapor deposition process include: vacuum degree: $4 \times 10^{-4}$ to $5 \times 10^{-4}$ Pa.

A fourth aspect of the disclosed is to provide use of any one of the composite material devices according to the disclosed embodiments for light absorption.

A fifth aspect of the disclosed is to provide use of any one of the composite material devices according to the disclosed embodiments for light to heat conversion.

A sixth aspect of the disclosed is to provide use of any one of the composite material devices according to the disclosed embodiments for desalination of sea water.

The substrate according to the disclosed embodiments may be a porous anodic alumina template. The porous anodic alumina template according to the disclosed embodiments may be common anodic alumina template in the art. The porous anodic alumina template may be abbreviated as AAO (Anodic Aluminum Oxide). For example, the porous anodic alumina templates may be single-through AAO templates manufactured by Hefei Microcrystal Technology Ltd, double-through AAO templates or V-type AAO templates. For example, the porous anodic alumina templates may be the anodic alumina with controllable multi branched channels as prepared by Chen Shuoshuo (see Controllable Multi-branched Channels Inside Anodic Aluminum Oxide: Fabrication and Applications, South China University of Technology, 2010), the anodic alumina templates having gradient nanometer pore diameter as disclosed by the patent document CN102925947A, and the porous anodic alumina templates having a Y-type structure as disclosed by the patent document CN101451260.

In one embodiment, examples of the metal particles according to the disclosed embodiments include all particles containing elemental metals, both pure metal particles and metal particles compounded with other materials, for example, metal particles with chemically modified surfaces, and further metal particles with surfaces covered by oxide layers.

In the disclosed, the particle size of the metal particles refers to the diameter of the circumscribed circle of the metal particles as shown in the scanning electron microscope photo of the cross section of the composite material device.

In the disclosed, the aspect ratio of the metal particles refers to the length to width ratio of the circumscribed rectangle having a minimum area of the metal particles as shown in the scanning electron microscope photo of the cross section of the composite material device.

In the disclosed, the shape of the metal particles refers to the shape of the metal particles as shown in the scanning electron microscope photo of the cross section of the composite material device.

In the disclosed, the pore diameter, porosity, pore to pore distance, pore shape of the templates and the disordered degree of the pores may be controlled by tuning the parameters of anodization.

In the disclosed, the particle size, shape or distribution of the metal particles may be controlled by tuning vacuum degree and/or deposition time of the physical vapor deposition.

In the disclosed, the symbol "≥" represents being greater than or equal to, and the "≤" represents being less than or equal to.

BENEFICIAL EFFECTS OF THE DISCLOSURE (1) The composite material devices according to the disclosed embodiments have high light absorbance;

(2) The composite material devices according to the disclosed embodiments have broad light absorption wavelength range;

(3) The composite material devices according to the disclosed embodiments have low reflectance;

(4) The composite material devices according to the disclosed embodiments are capable of converting absorbed optical energy into thermal energy;

(5) The composite material devices according to the disclosed embodiments is able to convert absorbed optical energy to heat energy, thereby used for liquid evaporation;

(6) The composite material devices according to the disclosed embodiments are porous, and when the composite material devices according to the disclosed embodiments are used for evaporating a liquid, these pores are advantageous for the effective escaping of the vapor of the liquid.

(7) The composite material devices according to the disclosed embodiments could be used for evaporating or purifying a liquid, especially for sea water desalination.

(8) The composite material devices according to the disclosed embodiments have the advantages of environmental friendliness, low cost, easiness to fabricate, and batch productions.

One or more of the above beneficial effects in accordance with the disclosed may be owned to the morphological characteristics of the metal particles in the composite material devices according to the disclosed embodiments, further may be owed to the morphological characteristics of the pores in the composite material devices according to the disclosed embodiments, and further may be owed to any of the previous characteristics of the composite material devices according to the disclosed embodiments.

DESCRIPTION OF THE DRAWINGS

The drawings as described here provide further understandings to the disclosed, being a part of the present application. The exemplary examples and descriptions thereof in the disclosed are used for interpreting the disclosed, and they are not used for restricting the disclosed. The drawings are described as follows.

DETAILED DESCRIPTION

Figure 1:
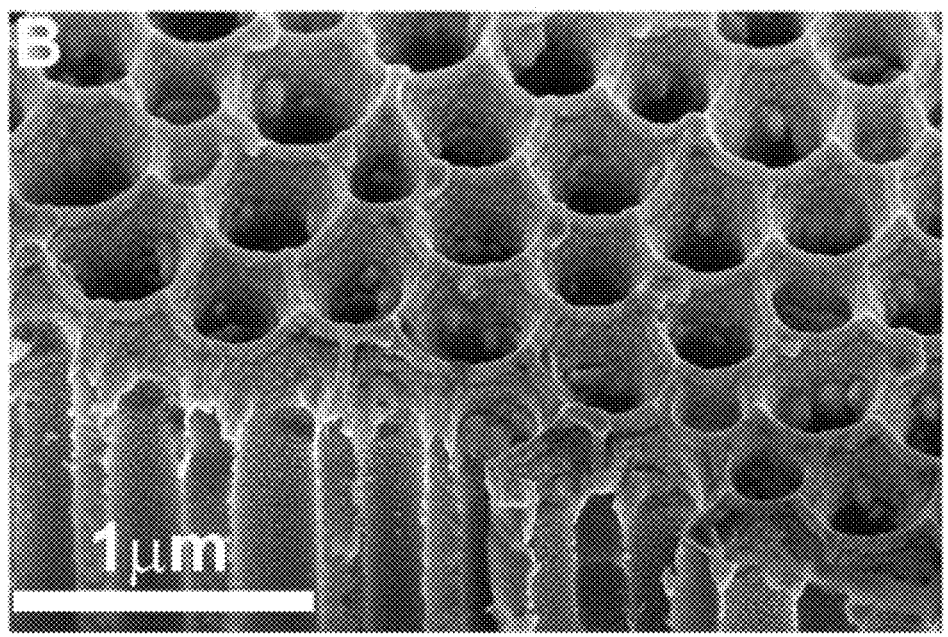
FIG. 1 is a scanning electron microscope photo of the Au/NPT in Example 1.

The disclosed provides the following specific embodiments and all possible combinations thereof. For the conciseness, the present application does not describe various specific combinations of the embodiments one by one. However, it should be recognized that the present application specifically describes and discloses all possible combinations of the specific embodiments.

One aspect of the disclosed is to provide a composite material device, comprising a substrate comprising a plurality of pores, and a plurality of metal particles adhered onto the inner walls of the pores, the metal particles having a particle size of from 1 to 200 nm, and said plurality of metal particles have at least x different particle sizes d, x being larger than or equal to 2.

In a preferred embodiment, for any one of the composite material devices according to the disclosed embodiments, the metal particles have a particle size of from 1 to 150 nm.

In a preferred embodiment, for any one of the composite material devices according to the disclosed embodiments, the metal particles have a particle size of from 1 to 100 nm.

In a preferred embodiment, for any one of the composite material devices according to the disclosed embodiments, x is equal to 2, 3, 4, 5, 6, 7, 8, 9 or 10.

In a preferred embodiment, for any one of the composite material devices according to the disclosed embodiments, the x different particle sizes d are x particle sizes selected from the group consisting of $d_1$ to $d_{10}$: 1 nm≤$d_1$<10 nm, 10 nm≤$d_2$<20 nm, 20 nm≤$d_3$<30 nm, 30 nm≤$d_4$<40 nm, 40 nm≤$d_5$<50 nm, 50 nm≤$d_6$<60 nm, 60 nm≤$d_7$<70 nm, 70 nm≤$d_8$≤80 nm, 80 nm≤$d_9$≤90 nm, 90 nm≤$d_{10}$≤100 nm.

In a preferred embodiment, for any one of the composite material devices according to the disclosed embodiments, the x different particle sizes d are x particle sizes selected from the group consisting of $d_{11}$ to $d_{15}$: 1 nm≤$d_{11}$<20 nm, 20 nm≤$d_{12}$<40 nm, 40 nm≤$d_{13}$<60 nm, 60 nm≤$d_{14}$≤480 nm, 80 nm≤$d_{15}$≤100 nm, x being equal to 2, 3, or 4 or 5.

In a preferred embodiment, for any one of the composite material devices according to the disclosed embodiments, the metal particles have an aspect ratio of from 1 to 10 (for example 1 to 8, further for example 1 to 6).

In a preferred embodiment, for any one of the composite material devices according to the disclosed embodiments, the plurality of metal particles have at least y aspect ratios e, y being greater than or equal to 2.

In a preferred embodiment, for any one of the composite material devices according to the disclosed embodiments, y is equal to 2, 3, 4, 5, 6, 7 or 8.

In a preferred embodiment, for any one of the composite material devices according to the disclosed embodiments, the y aspect ratios e are selected from any y aspect ratios selected from the group consisting of $e_1$ to $e_8$: $1 \leq e_1 < 1.2$, $1.2 \leq e_2 < 1.5$, $1.5 \leq e_3 < 2$, $2 \leq e_4 < 3$, $3 \leq e_5 < 4$, $4 \leq e_6 < 6$, $6 \leq e_7 \leq 8$, $8 \leq e_8 \leq 10$.

In a preferred embodiment, for any one of the composite material devices according to the disclosed embodiments, the y aspect ratios e are selected from any y aspect ratios selected from the group consisting of the following $e_9$ to $e_{12}$: $1 \leq e_9 < 2$, $2 \leq e_{10} < 3$, $3 \leq e_{11} < 4$, $4 \leq e_{12} \leq 6$, y being equal to 2, 3 or 4.

In a preferred embodiment, for any one of the composite material devices according to the disclosed embodiments, the metal particles have one, two or three shapes selected from: rod, ellipse and sphere.

In a preferred embodiment, for any one of the composite material devices according to the disclosed embodiments, the metal particles are disposed such that the distance between the adjacent metal particles is from 1 to 50 nm, for example 1 to 30 nm, and further 1 to 15 nm.

In a preferred embodiment, for any one of the composite material devices according to the disclosed embodiments, the metal particles have a distributing density of from about $10^2$ to about $10^4$ particles/$\mu m^2$, for example from about $10^3$ to about $10^4$ particles/$\mu m^2$, and further from about $2 \times 10^3$ to about $5 \times 10^3$ particles/$\mu m^2$, on the inner walls of the pores.

In a preferred embodiment, for the composite material devices according to the disclosed embodiments, the metal particles are disposed at a position from g to h μm in depth from a surface of a side of the substrate to the interior of the substrate in a range, g<h;

$g \geq 0$, preferably from 0 to 5, more preferably about 0, 1, 2, 3, 4 or 5;

$h \geq 0$, preferably from 0 to 10, more preferably about 1, 2, 3, 4, 5, 6, 7, 8, 9 or 10.

In a preferred embodiment, for the composite material device according to the disclosed embodiments, the metal particles have a size gradient from one side to the other side of the substrate.

In a preferred embodiment, for the composite material device according to the disclosed embodiments, the metal particles have an aspect ratio gradient from one side to the other side of the substrate.

In a preferred embodiment, for the composite material device according to the disclosed embodiments, said metal particles have shapes varying from one side to the other side of the substrate.

In a preferred embodiment, for the composite material device according to the disclosed embodiments, the metal particles varies have shapes varying from a rod shape to an ellipsoid shape, and further to a sphere-like shape.

In a preferred embodiment, for the composite material device according to the disclosed embodiments, the plurality of metal particles are disorderedly distributed on the inner walls of the pores.

In a preferred embodiment, for the composite material device according to the disclosed embodiments, materials for the metal particles are made of a metal selected from the group consisting of: noble metals (such as gold, silver or platinum), transition metals (such as copper) and light metals (such as aluminum).

In a preferred embodiment, for the composite material device according to the disclosed embodiments, the metal particles are made of a metal of gold or aluminum.

In a preferred embodiment, for the composite material device according to the disclosed embodiments, the plurality of pores have at least z pore diameters f, z being greater than or equal to 2.

Another aspect of the disclosed is to provide a composite material device, comprising a substrate, a plurality of pores provided on the substrate, and a plurality of metal particles adhered onto inner walls of the pores, the plurality of pores have at least z different pore diameters f, z being larger than or equal to 2.

In a preferred embodiment, for the composite material device according to the disclosed embodiments, z is equal to 3, 4, 5, 6, 7 or 8.

In a preferred embodiment, for the composite material device according to the disclosed embodiments, the z different pore diameters f are any z pore diameters selected from the group consisting of $f_1$ to $f_8$: $100 \leq f_1 < 150$, $150 \leq f_2 < 200$, $200 \leq f_3 < 250$, $250 \leq f_4 < 300$, $300 \leq f_5 < 350$, $350 \leq f_6 < 400$, $400 \leq f_7 < 450$, $450 \leq f_8 \leq 500$, z being equal to 2, 3, 4, 5, 6, 7 or 8.

In a preferred embodiment, for the composite material device according to the disclosed embodiments, the z different pore diameters f are any z pore diameters selected from the group consisting of $f_9$ to $f_{13}$: $160 \leq f_9 < 200$, $200 \leq f_{10} < 250$, $250 \leq f_{11} < 300$, $300 < f_{12} < 350$, $350 < f_{13} \leq 380$, z being equal to 2, 3, 4 or 5.

In a preferred embodiment, for the composite material device according to the disclosed embodiments, the pores have an average pore diameter of from 200 to 1000 nm.

In a preferred embodiment, for the composite material device according to the disclosed embodiments, the pores have an average pore diameter of from 300 to 600 nm.

In a preferred embodiment, for the composite material device according to the disclosed embodiments, the pores have an average pore diameter of from 300 to 500 nm.

In a preferred embodiment, for the composite material device according to the disclosed embodiments, the pores have an average pore diameter of from 350 to 500 nm.

In a preferred embodiment, for the composite material device according to the disclosed embodiments, the pores have an average pore diameter of from 350 to 400 nm.

In a preferred embodiment, for the composite material device according to the disclosed embodiments, the pores have aspect ratios ranging from 1 to 3, for example from 1 to 2, and further for example 1 to 1.5.

In a preferred embodiment, for the composite material device according to the disclosed embodiments, the pores include pores having aspect ratios of about 1, 1.1, 1.2, 1.3, 1.4 and 1.5.

In a preferred embodiment, for the composite material device according to the disclosed embodiments, the pores include pores having aspect ratios of about 1, 1.2, 1.4, 1.5, 1.8 and 2.

In a preferred embodiment, for the composite material device according to the disclosed embodiments, the pores have an average pore-to-pore distance between adjacent pores of from 300 to 600 nm, preferably from 400 to 500 nm.

In a preferred embodiment, for the composite material device according to the disclosed embodiments, the pores have two, three, four, five or six shapes selected from: triangle, quadrilateral, pentagons, hexagons, circle, and ellipse.

In a preferred embodiment, for the composite material device according to the disclosed embodiments, the substrate has a porosity of from 20 to 80%, preferably from 40 to 70%, and most preferably from 50 to 60%, on at least one surface of the substrate.

In a preferred embodiment, for the composite material device according to the disclosed embodiments, the pores are distributed disorderly on a surface of the substrate.

In a preferred embodiment, for the composite material device according to the disclosed embodiments, when a Fourier transform is performed on a scanning electron microscope photo of a surface of a side of the substrate to which the metal particles are adjacent, a Fourier transform picture showing a ring having an outer to inner diameter ratio of 2 or above, preferably 2.5 or above, further preferably from 2.5 to 5, further preferably from 2.5 to 3.5, and most preferably from 2.8 to 3.2 is obtained.

In a preferred embodiment, for the composite material device according to the disclosed embodiments, the pores have straight or curve pore channels.

In a preferred embodiment, for the composite material device according to the disclosed embodiments, the pores have pore channels at an angle of 90 degrees relative to a surface of the substrate, or the pores have pore channels at an angel of other than 90 degrees relative to a surface of the substrate.

In a preferred embodiment, for the composite material device according to the disclosed embodiments, the pores are through pores or non-through pores.

In a preferred embodiment, for the composite material device according to the disclosed embodiments, the composite material devices have a shape of a planar plate or a curved plate.

In a preferred embodiment, for the composite material device according to the disclosed embodiments, the composite material devices have a total thickness from 20 to 200 μm, preferably from 50 to 100 μm.

In a preferred embodiment, for the composite material device according to the disclosed embodiments, the substrate is covered with a metal layer on a surface of a side thereof to which said metal particles are adjacent.

In a preferred embodiment, for the composite material device according to the disclosed embodiments, the metal layer only covers the regions of the surface without pores.

In a preferred embodiment, for the composite material device according to the disclosed embodiments, the metal layer has a total thickness from 50 to 100 nm, preferably from 60 to 90 nm.

In a preferred embodiment, for the composite material device according to the disclosed embodiments, the pores are non-through pores, and the metal layer only covers the regions of the surface without pores.

In a preferred embodiment, for the composite material device according to the disclosed embodiments, the pores are through pores, and the metal layer is deposited on a surface of a side to which the metal particles are adjacent.

In a preferred embodiment, for the composite material device according to the disclosed embodiments, the metal layer is made of a metal selected from the group consisting of: noble metals (such as gold, silver, or platinum), transition metals (such as copper) or light metals (such as aluminum).

In a preferred embodiment, for the composite material device according to the disclosed embodiments, the substrate is made of a dielectric material.

In a preferred embodiment, for the composite material device according to the disclosed embodiments, the substrate is made of a metal oxide.

In a preferred embodiment, for the composite material device according to the disclosed embodiments, the substrate is made of alumina or a titanium dioxide.

In a preferred embodiment, for the composite material device according to the disclosed embodiments, said substrate is obtained by an anodization method.

In a preferred embodiment, for the composite material device according to the disclosed embodiments, the metal particles is made by a physical vapor deposition process.

In a preferred embodiment, for the composite material device according to the disclosed embodiments, the physical vapor deposition is performed under a vacuum degree of from $4\times10^{-4}$ to $6\times10^{-4}$ Pa.

In a preferred embodiment, for the composite material device according to the disclosed embodiments, the physical vapor deposition process comprises one or more of sputtering and evaporation.

In a preferred embodiment, for the composite material device according to the disclosed embodiments, the physical vapor deposition process is an ion beam sputtering process.

In a preferred embodiment, for the composite material device according to the disclosed embodiments, the ion beam sputtering process is performed under one or more conditions of (i) to (iv):

(i) a vacuum degree of from $4\times10^{-4}$ to $6\times10^{-4}$ Pa, for example of about $5\times10^{-4}$ Pa;

(ii) an ion gun voltage of from 6 to 8 keV, for example of about 7 keV;

(iii) an ion current of from 200 to 400 μA, for example of about 300 μA;

(iv) a sputtering time of from 5 to 20 minutes, for example of from 8 to 16 minutes.

In a preferred embodiment, for the composite material device according to the disclosed embodiments, the physical vapor deposition process is an electron beam evaporation process.

In a preferred embodiment, for the composite material device according to the disclosed embodiments, the electron beam evaporation is performed under one or more condition (i) to (ii):

(i) a vacuum degree of from $4\times10^{-4}$ to $6\times10^{-4}$ Pa, for example of about $6\times10^{-4}$ Pa;

(ii) a film-plating rate of 1 Å/s.

In a preferred embodiment, for the composite material device according to the disclosed embodiments, the composite material device has an average light absorption rate of higher than 85%, preferably higher than 90%, further preferably higher than 95%, and most preferably higher than 99%.

In a preferred embodiment, for the composite material device according to the disclosed embodiments, the device is capable of absorbing light having a wavelength ranging from 1 nm to 50 μm, for example, from 200 nm to 25 μm, further from 200 nm to 20 μm, further from 200 nm to 10 μm, further from 400 nm to 20 μm, further from 400 nm to 10 μm, further from 400 nm to 5 μm, and further from 400 nm to 2.5 μm.

In a preferred embodiment, for the composite material device according to the disclosed embodiments, the device can convert liquid water to steam by utilizing the light when it is under light irradiation, with an energy conversion efficiency of higher than 80%, preferably higher than 90%, and most preferably higher than 95%.

In a preferred embodiment, for the composite material device according to the disclosed embodiments, the light has a power density of 1 $kWm^{-2}$ or above, preferably from 2 to 6 $kWm^{-2}$, and most preferably from 3 to 4 $kWm^{-2}$.

In a preferred embodiment, for the composite material device according to the disclosed embodiments, the metal particles have a material capable of improving the performances of said metal particles disposed thereon.

In a preferred embodiment, for the composite material device according to the disclosed embodiments, the material capable of improving the performances of the metal particles can improve the antioxidant property and/or corrosion resistance of the metal particles.

In a preferred embodiment, for the composite material device according to the disclosed embodiments, a material capable of improving the performances of the metal particles is disposed on the metal particles.

In a preferred embodiment, for the composite material device according to the disclosed embodiments, the material capable of improving the performances of the metal particles includes metallic materials, inorganic non-metallic materials and/or organics.

In a preferred embodiment, for the composite material device according to the disclosed embodiments, the material capable of improving the performances of the metal particles includes oxides, for example metal oxides, and further for example alumina.

In a preferred embodiment, for the composite material device according to the disclosed embodiments, the material capable of improving the performances of the metal particles has a composition which is different from the composition of the metal particles.

Materials capable of improving the performances of the metal particles is disposed on the metal particles. For example, materials capable of improving the antioxidant or corrosion resistance of the metal oxide is disposed on the metal particles. By this way, the properties of metal particles is improved, and the performances of the composite material devices is improved. For example, the lifetime and reliability of the composite material devices is improved.

A further aspect of the disclosed is to provide a method for producing any one of the composite material devices according to the disclosed embodiments, comprising depositing metal particles both on a surface of a substrate and on the inner walls of the pores of the substrate by a physical vapor deposition process.

A further aspect of the disclosed is to provide a method for producing any one of the composite material devices according to the disclosed embodiments, wherein the physical vapor deposition process is an ion beam sputtering process.

A further aspect of the disclosed is to provide a method for producing any one of the composite material devices according to the disclosed embodiments, wherein said ion beam sputtering process is performed under one or more conditions of (i) to (iv):

(i) a vacuum degree of from $4 \times 10^{-4}$ to $6 \times 10^{-4}$ Pa, for example of about $5 \times 10^{-4}$ Pa;

(ii) an ion gun voltage of from 6 to 8 keV, for example of about 7 keV;

(iii) an ion current of from 200 to 400 μA, for example of about 300 μA;

(iv) a sputtering time of from 5 to 20 minutes, for example of from 8 to 16 minutes.

A further aspect of the disclosed is to provide a method for producing any one of the composite material devices according to the disclosed embodiments, wherein the physical vapor deposition method is an electron beam evaporation.

A further aspect of the disclosed is to provide a method for producing any one of the composite material devices according to the disclosed embodiments, wherein said electron beam evaporation is performed under one or more condition (i) to (ii):

(i) a vacuum degree of from $4 \times 10^{-4}$ to $6 \times 10^{-4}$ Pa, for example of about $6 \times 10^{-4}$ Pa;

(ii) a film-plating rate of 1 Å/s.

A further aspect of the disclosed is to provide a method for producing any one of the composite material devices according to the disclosed embodiments, comprising applying a material capable of improving the performances of the metal particles thereon.

A further aspect of the disclosed is to provide a method for producing any one of the composite material devices according to the disclosed embodiments, wherein the material capable of improving the performances of the metal particles by means of oxidizing, growing, depositing, sputtering and/or coating.

A further aspect of the disclosed is to provide use of any one of the composite material devices according to the disclosed embodiments to absorb light.

A further aspect of the disclosed is to provide use of any one of the composite material devices according to the disclosed embodiments to convert light into heat.

A further aspect of the disclosed is to provide use of any one of the composite material devices according to the disclosed embodiments to desalinate sea water.

BEST MODES FOR CARRYING OUT THE DISCLOSED

By the drawings and example, the technical solution of the disclosed is further described in detail.

Example 1

Step 1: Porous anodic alumina templates (hereafter abbreviated as NPT) were manufactured by a two-step anodic oxidation method. The method comprised the following steps: an aluminum foil was placed in 0.3 M phosphoric acid at 5° C. for the anodic oxidation; the oxidation voltage, starting from 50 V, was increased by 10 V in every 2 minutes, until it reached 150 V, and the voltage was kept for 24 hours, thereby to finish the first oxidation; thereafter, the alumina film formed in the first oxidation was removed by dissolving it, and under the same conditions as those of the first oxidation, the second oxidation was performed; after the second oxidation, the aluminum foil coated with a porous aluminum film was placed in a mixture liquid containing 1 M $CuCl_2$ and 0.1 M HCl to remove the aluminum substrate by dissolution; at last, the porous aluminum film was transferred into 5 wt % $H_3PO_4$, to expand pores at 30° C. for about 1 h, thereby to produce the NPT of Example 1.

FIG. 1 was a scanning electron microscope photo of the Au/NPT. The thickness of the NPT was about 60 μm. The NPT had the through pores vertical to its surface. Particularly, the morphologies of the pores on the two sides of the NPT were different. As for a surface of a side of NPT that is farther to the aluminum foil during anodic oxidation, the morphology of the pores on the surface was relatively ordered, and thus the surface was referred to as the ordered surface of the NPT. As for a surface of a side of the NPT that is closer to the aluminum foil during the anodic oxidation, the morphology of the surface was more disordered, and thus the surface was referred to as a disordered surface of the NPT.

Step 2: Gold (Au) particles were deposited both on the ordered surface of the NPT and in the pores on this surface by using an ion beam film-plating meter Gatan Model 682. Particularly, the deposition conditions included: vacuum degree of $5\times10^{-4}$ Pa, electron gun voltage of 7 kev, electric current of 300 µA, and depositing time of 16 min. The obtained product was the composite material device of Example 1, hereafter abbreviated as Au/NPT.

The Au/NPT comprised a NPT and gold particles adhered onto the inner walls of the pores of the NPT. The gold particles were disposed at a position from 0 to 2 µm in depth from the ordered surface of the NPT to the interior. The Au/NPT may further comprised a gold layer covered on the ordered surface of the NPT, and the gold layer may only cover the regions without pores on the ordered surface. The thickness of the gold layer was from about 60 to 90 nm, and the total thickness of the Au/NPT was about 60 µm. After gold was deposited on the ordered surface of the NPT, the ordered surface of the Au/NPT could be provided.

Figure 2:
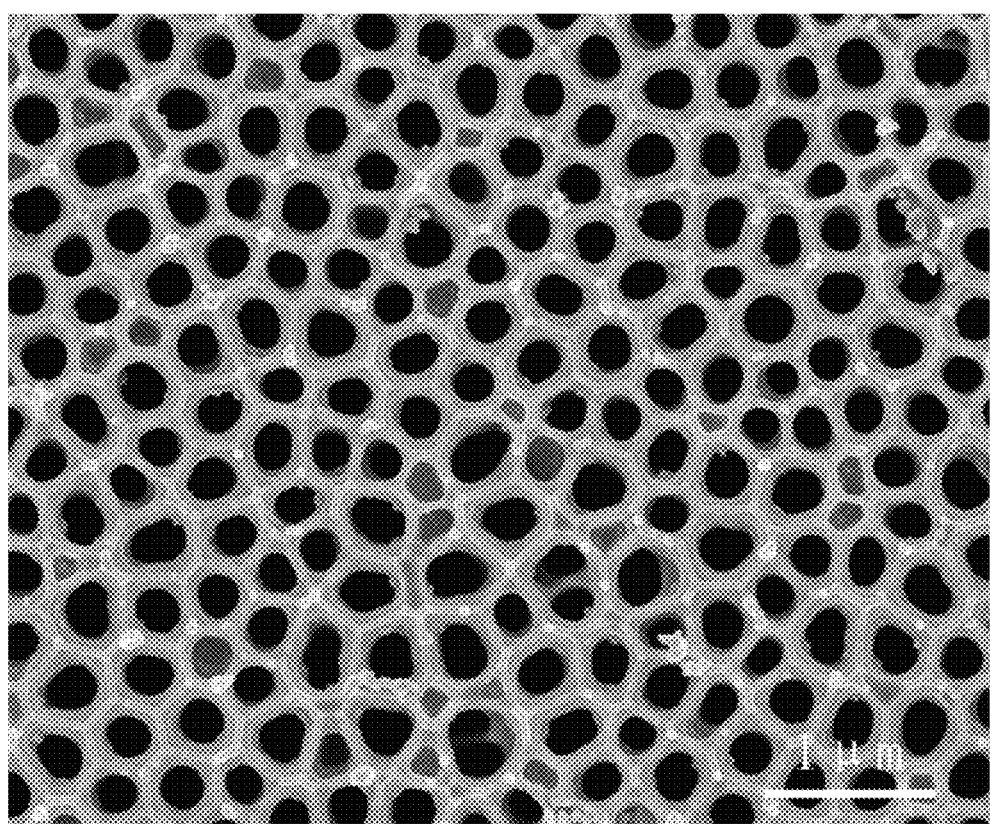
FIG. 2 is a scanning electron microscope photo of the ordered surface of the Au/NPT in Example 1.

FIG. 2 was a high resolution scanning electron microscope photo of the ordered surface of the Au/NPT. As shown in FIG. 2, there were a plurality of pores having different pore diameters on the ordered surface of the Au/NPT, and the pore diameter was disposed in a range from 250 to 360 nm. The average pore diameter was about 300 nm, the average pore-to-pore distance between adjacent pores was about 450 nm, and the porosity was about 40%. The pores had similar pore diameters and similar aspect ratios, and similar shapes. Particularly, as the figure showed, there are pores having a pore diameter of 250 nm, pores having a pore diameter of 280 nm, pores having a pore diameter of 290 nm, pores having a pore diameter of 300 nm, pores having a pore diameter of 310, pores having a pore diameter of 330 nm, pores having a pore diameter of 350 nm, and pores having a pore diameter of 360 nm.

Fifty pores in FIG. 2 were randomly picked and their pore diameters were measured. The distribution frequency of different pore diameters is shown in Table 1:

TABLE 1

| Pore diameter (nm) | 250-300 | 300-360 |
|---|---|---|
| Distribution frequency % | 84% | 16% |

Further, as shown in FIG. 2, the pores as shown in the figure had different aspect ratios, and an aspect ratio was disposed in a range from 1 to 1.44. As shown in the figure, there are pores having an aspect ratio of 1.00, pores having an aspect ratio of 1.04, pores having an aspect ratio of 1.07, pores having an aspect ratio of 1.08, pores having an aspect ratio of 1.11, pores having an aspect ratio of 1.15, pores having an aspect ratio of 1.19, pores having an aspect ratio of 1.21, pores having an aspect ratio of 1.25, pores having an aspect ratio of 1.28, pores having an aspect ratio of 1.31, and pores having an aspect ratio of 1.44.

Further, as shown in FIG. 2, the shape of the pores was substantially ellipse or circle.

Example 2

(1) A NPT was produced by using the method in Example 1.

(2) Gold (Au) is deposited both on the disordered surface of the NPT and on the inner walls of the pores on the disordered surface by using an ion beam film plating meter Gatan Model 682, in particular, the vacuum degree being $5\times10^{-4}$ Pa, the electron gun voltage being 7 KeV, the electric current being 300 uA, and the depositing time being 16 min. The resultant product was the composite material device of Example 2 (hereafter abbreviated as Au/D-NPT).

Au/D-NPT comprised a NPT and gold particles adhered onto the inner walls of the pores of the NPT. The gold particles were disposed at a position from 0 to 2 µm in depth from the disordered surface of the NPT to the interior. Au/D-NPT further comprised a gold layer covered on the disordered surface of the NPT, and the gold layer only cover the regions without pores on the disordered surface. The thickness of the gold layer was from about 60 to 90 nm, and the thickness of Au/D-NPT was about 60 µm. After gold was deposited on the disordered surface of the NPT, the disordered surface of Au/D-NPT can be provided.

Figure 3:
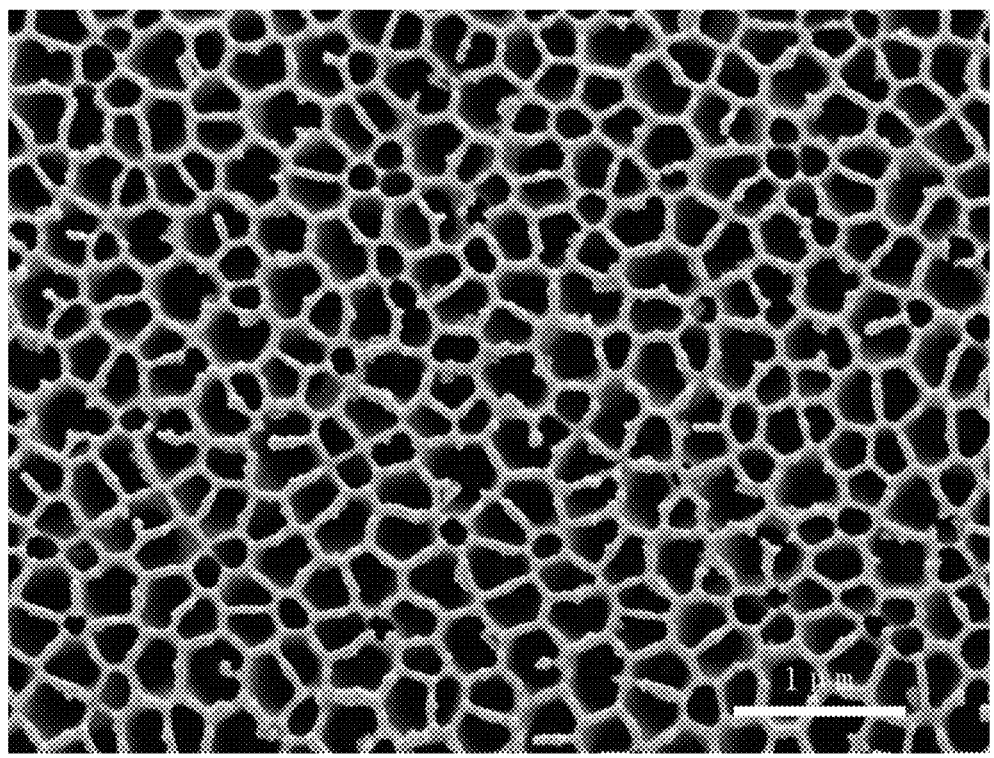
FIG. 3 is a scanning electron microscope photo of the disordered surface of Au/D-NPT in Example 2.

FIG. 3 is a high resolution scanning electron microscope photo of the disordered surface of Au/D-NPT. As shown in FIG. 3, Au/D-NPT had a plurality of pores having different pore diameters, and the pore diameter ranges from 160 to 370 nm. There were pores having pore diameters from 160 to 200 nm, such as pores having a pore diameter of 160 nm, pores having a pore diameter of 180 nm, and pores having a pore diameter of 200 nm, pores having a pore diameter of from 200 to 250 nm, pores having a pore diameter of 240 nm, pores having pore diameters from 250 to 300 nm, such as pores having a pore diameter of 260 nm, pores having a pore diameter of 280 nm, and pores having a pore diameter of 300 nm, pores having pore diameters from 300 to 350 nm, such as pores having a pore diameter of 320 nm, pores having a pore diameter of 340 nm, and pores having a pore diameter of 350 nm, pores having pore diameters from 350 to 380 nm, such as pores having a pore diameter of 370 nm. The pores have an average pore diameter of 380 nm. The device has an average pore size of 360 nm, and an average pore-to-pore distance between adjacent pores of about 450 nm, and a porosity of about 59%.

Fifty pores in FIG. 3 were randomly picked and their diameters were measured, and the distribution frequency of different pore diameters was shown in Table 2:

TABLE 2

| Pore diameter (nm) | 100-200 | 200-300 | 300-400 |
|---|---|---|---|
| Distribution frequency % | 33% | 42% | 25% |

Further, as shown in FIG. 3, the pores of Au/D-NPT had different aspect ratios of from 1 to 2. There are pores having an aspect ratio of 1.00, pores having an aspect ratio of 1.03, pores having an aspect ratio of 1.07, pores having an aspect ratio of 1.13, pores having an aspect ratio of 1.16, pores having an aspect ratio of 1.22, pores having an aspect ratio of 1.29, pores having an aspect ratio of 1.33, pores having an aspect ratio of 1.38, pores having an aspect ratio of 1.41, pores having an aspect ratio of 1.54, pores having an aspect ratio of 1.67, and pores having an aspect ratio of 1.91.

Further, as shown in FIG. 3, the pores have various shapes. For example, there are pores having shapes as follows: triangle, quadrilateral, pentagons, hexagons, n-polygon (n is greater than or equal to 7), circle, and ellipse.

Figure 4:
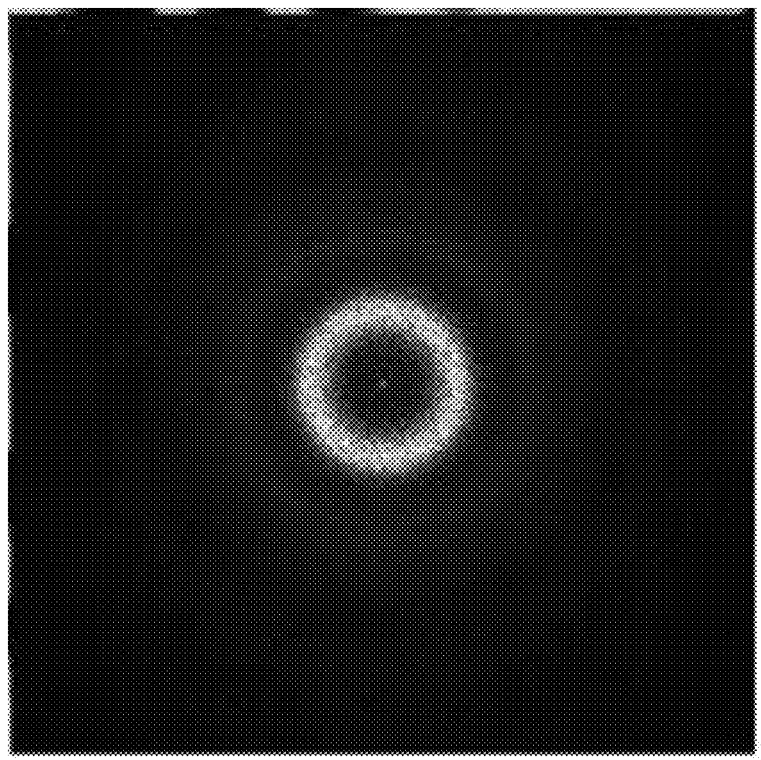
FIG. 4 is a Fourier transform diagram of FIG. 2.
Figure 5:
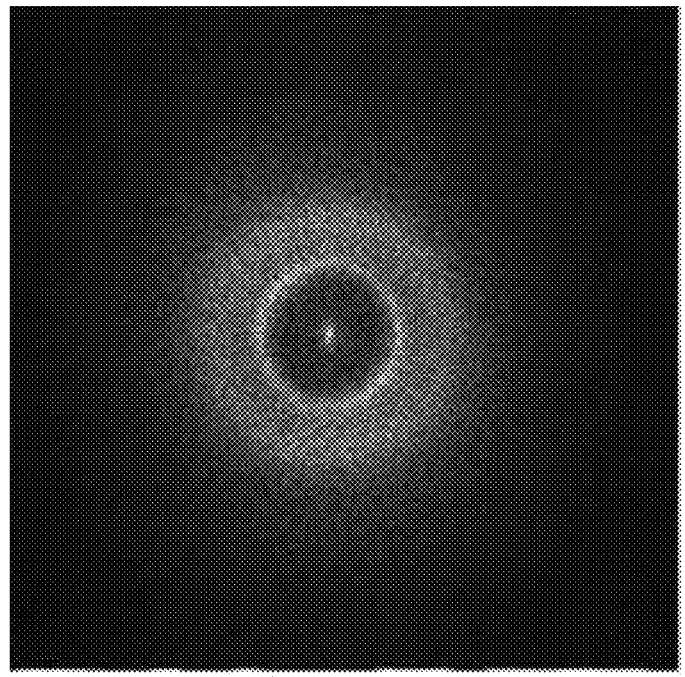
FIG. 5 is a Fourier transform diagram of FIG. 3.

FIG. 4 and FIG. 5 are Fourier transform diagrams of FIGS. 2 and 3 respectively. There are more reciprocal lattice vectors in FIG. 5 than that in FIG. 4, and the reciprocal lattice vectors in FIG. 5 are more dispersed than those in FIG. 4. This demonstrates that the pore morphology in FIG. 3 was more disordered and random than that in FIG. 2. Particularly, there is a ring having an outer diameter to inner diameter ratio of about 2.16 in the Fourier transform diagram, i.e. FIG. 4, and there is a ring having an outer diameter to inner diameter ratio of about 2.92 in the Fourier transform diagram, i.e. FIG. 5.

Figure 6:
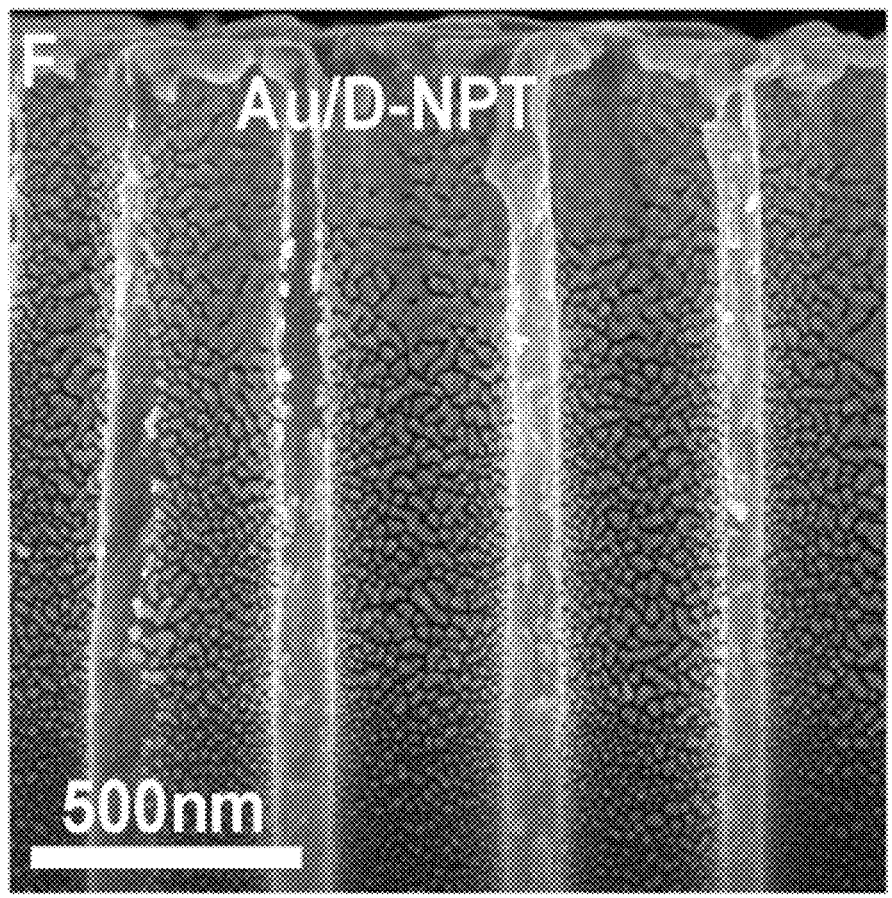
FIG. 6 is a scanning electron microscope photo of Au/D-NPT in Example 2.

FIG. 6 is a high resolution scanning electron microscope photo of the section of the composite material device (Au/D-NPT) of Example 2. As shown in FIG. 6, the inner walls of the pores in Au/D-NPT are adhered with a plurality of metal particles, and these metal particles have different sizes, aspect ratios or shapes.

Figure 7:
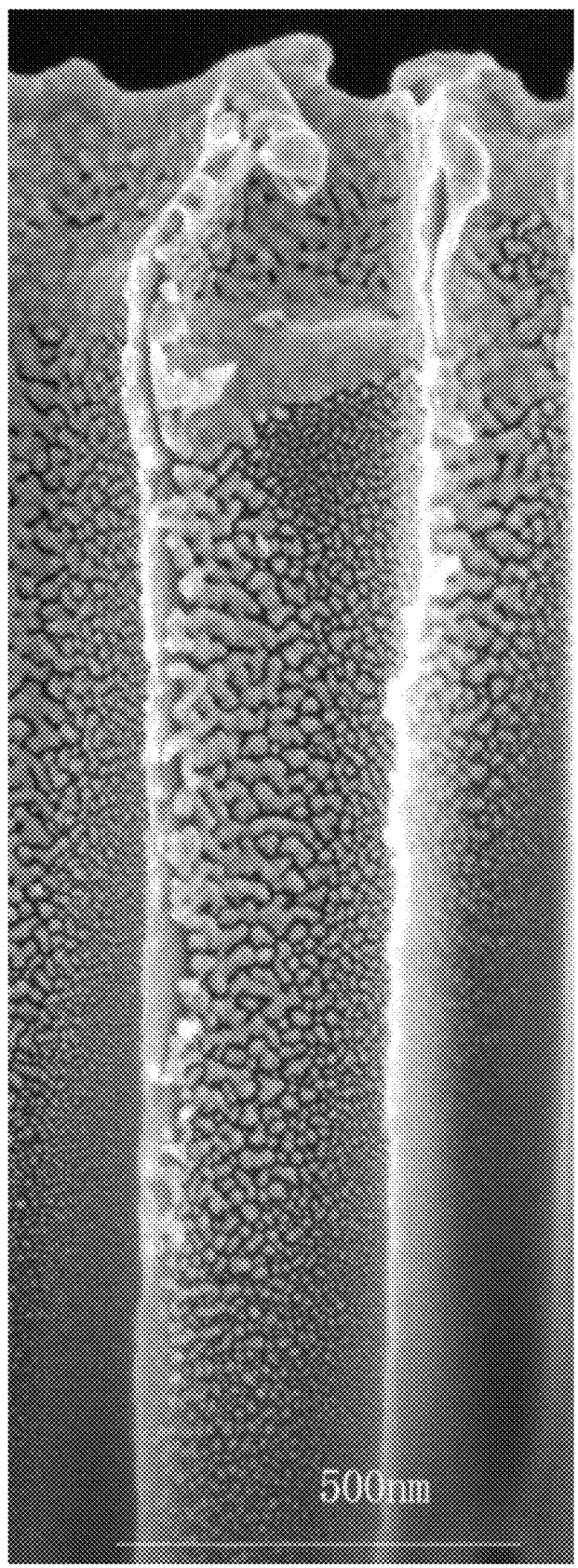
FIG. 7 is a scanning electron microscope photo of a local region of Au/D-NPT in Example 2.

FIG. 7 is an enlarged view of a local section of the composite material device (Au/D-NPT) in Example 2. As shown in FIG. 7, a plurality of metal particles were deposited on the inner walls of the pores in Au/D-NPT, and these metal particles had a distributing density of about form $10^3$ to $10^4$ particles/μm$^2$, for example about from $2.67 \times 10^3$ to $4.86 \times 10^3$ particles/μm$^2$.

Further, the metal particles had different sizes in a range from 1 to 100 nm. The figure showed, for example, there are metal particles having sizes from 1 to 20 nm, such as metal particles having a size of 5.44 nm, metal particles having a size of 9.07 nm, metal particles having a size of 11.47 nm, metal particles having a size of 14.95 nm, and metal particles having a size of 17.20 nm; there are metal particles having sizes from 20 to 40 nm, such as metal particles having a size of 21.91 nm, metal particles having a size of 26.96 nm, metal particles having a size of 31.64 nm, metal particles having a size of 36.69 nm, and metal particles having a size of 38.04 nm; there are metal particles having a size of from 40 to 60 nm, such as metal particles having a size of 83.14 nm, metal particles having a size of 41.67 nm, metal particles having a size of 43.87 nm, metal particles having a size of 51.33 nm, and metal particles having a size of 57.59 nm; there are metal particles having a size of from 60 to 80 nm, such as metal particles having a size of 62.58 nm, metal particles having a size of 68.20 nm, metal particles having a size of 71.51 nm, metal particles having a size of 76.59 nm, and metal particles having a size of 79.24 nm; and there are metal particles having a size of from 80 to 100 nm, such as metal particles having a size of 82.04 nm, metal particles having a size of 83.14 nm, metal particles having a size of 92.30 nm, metal particles having a size of 94.52 nm, and metal particles having a size of 97.33 nm.

The particle sizes of the gold particles in FIG. 7 were randomly picked and measured, and the resultant distribution frequency corresponding to different particle sizes are shown in Table 3

TABLE 3

| Particle size (nm) | 1~13.8 | 13.8~35.4 | 35.4~78.6 | 78.6~100 |
|---|---|---|---|---|
| Distribution frequency % | 37.5% | 33.3% | 22.5% | 6.7% |

Further, as shown in FIG. 7, the metal particles had different aspect ratios in a range from 1 to 6. For example, there are metal particles having aspect ratios from 1 to 2, such as metal particles having an aspect ratio of 1.06, metal particles having an aspect ratio of 1.18, metal particles having an aspect ratio of 1.37, metal particles having an aspect ratio of 1.64, and metal particles having an aspect ratio of 1.83; there are metal particles having aspect ratios in a range from 2 to 3, such as metal particles having an aspect ratio of 2.05, metal particles having an aspect ratio of 2.14, metal particles having an aspect ratio of 2.40, metal particles having an aspect ratio of 2.52, and metal particles having an aspect ratio of 2.72; there are metal particles having aspect ratio in a range from 3 to 4, such as metal particles having an aspect ratio of 3.05, metal particles having an aspect ratio of 3.58, and metal particles having an aspect ratio of 3.86; and there are metal particles having aspect ratios in a range from 4 to 6, such as metal particles having an aspect ratio of 4.69, metal particles having an aspect ratio of 4.81, metal particles having an aspect ratio of 5.03, and metal particles having an aspect ratio of 5.63.

Further, as shown in FIG. 7, a plurality of metal particles have various shapes. For example, There are rod metal particles, ellipse metal particles, and circle-like metal particles.

Further, as shown in FIG. 7, from the disordered surface to the interior of Au/D-NPT, with the increase of the pore depth, the metal particles had a size gradient. For example, the particle size gradually varied from about 100 nm to 1 nm.

Further, as shown in FIG. 7, from the disordered surface of Au/D-NPT to the interior, with the increase of the pore depth, the metal particles had an aspect ratio gradient. For example, the aspect ratio gradually varied from about 6 to about 1.

Further, as shown in FIG. 7, from the disorder surface of Au/D-NPT to the interior, with the increase of the pore depth, the shape of the metal particles gradually varied. For example, the metal particles gradually varied from a rod shape to an ellipse shape, and then from the ellipse shape to a circle shape.

Figure 8:
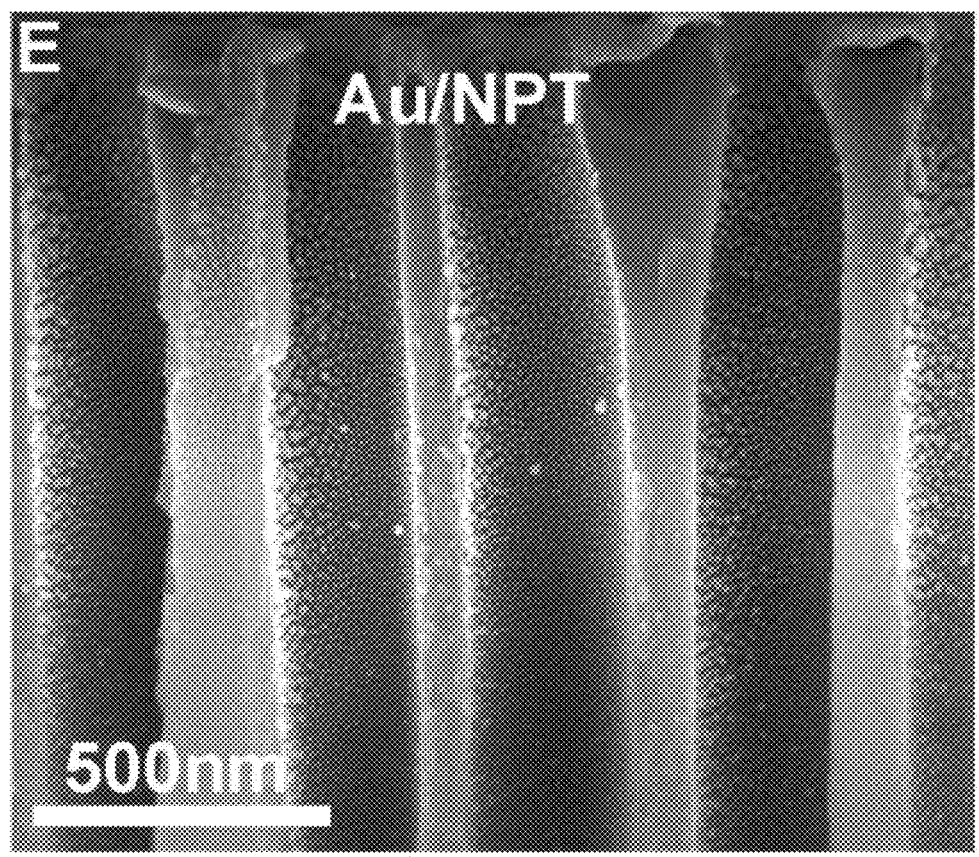
FIG. 8 is a scanning electron microscope photo of Au/NPT in Example 1.

FIG. 8 is a high resolution scanning electron microscope photo of the section of the composite material device (Au/NPT) in Example 1. As shown in FIG. 8, the metal particles in Au/NPT of Example 1 have substantially identical characteristics to the metal particles in Au/D-NPT of Example 2.

Example 3

Step 1: A method for producing NPT having an average pore diameter of about 200 nm is described as follows:

Porous anodic alumina templates (hereafter abbreviated as NPT) was fabricated by a two-step anodic oxidation method. The method comprises the following steps: an aluminum foil was placed in 0.5 M phosphoric acid at 5° C. for anodic oxidation; the voltage of anodic oxidation started from 50 V, increased by 10 V in every 2 minutes, until it reached 150 V, and the voltage was kept for 24 hours, thereby to finish the first oxidation; thereafter, the alumina film formed in the first oxidation was dissolution removed, and under the same conditions as those of the first oxidation, the second oxidation was performed; after the second oxidation, the aluminum foil coated with a porous aluminum film was placed in a mixture liquid of 1 M CuCl$_2$ and 0.1 M HCl to remove the aluminum substrate by dissolution; at last, the porous aluminum film was transferred into 5 wt % H$_3$PO$_4$, to expand pores at 30° C. for about 1 h, thereby to produce the NPT of Example 1.

Step 2: Step 2 is same as its counterpart in example 1, except that the deposition time is changed to 12 minutes, the composite material device Au/NPT-200 of Example 3 was fabricated.

Example 4

Step 1: The NPT was fabricated according to the method in Example 1.

Step 2: Step 2 is same as its counterpart in example 3, except that the deposition time was adjusted to 8 minutes, 12 minutes and 16 minutes respectively, and subsequently the composite material devices Au/D-NPT-8, Au/D-NPT-12, and Au/D-NPT-16 of Example 4 were fabricated.

Example 5

(1) A NPT was fabricated by using the method according to Example 1.

(2) Aluminum (Al) were deposited on the disordered surface of the above NPT and in the pores on the surface by means of electron beam evaporation (apparatus: FU-20PEB-RH); the electron beam evaporation was performed under following conditions: vacuum degree: 6×10$^{-4}$ Pa and film-plating rate: 1 Å/s. The resultant product was the composite material device (hereafter abbreviated as Al/D-NPT) of Example 5.

Figure 9:
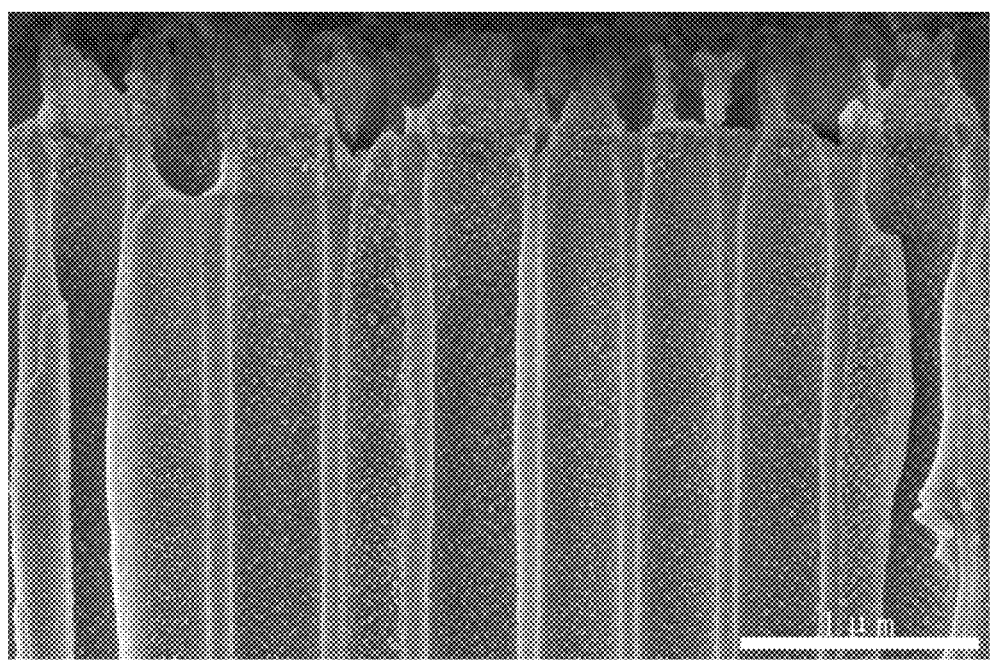
FIG. 9 is a scanning electron microscope photo of Al/D-NPT in Example 5.

FIG. 9 is a scanning electron microscope photo of Al/D-NPT. As shown in the figure, Al/D-NPT comprised a NPT and aluminum particles adhered onto the inner walls of the pores in the NPT. The aluminum particles are disposed at a position from 0 to 4 μm in depth from the disordered surface of the NPT to the interior of the NPT. Al/D-NPT further comprised an aluminum layer covered on the disordered surface of the NPT. The aluminum layer only cover the regions without pores, the thickness of the aluminum layer being about 85 nm. Al/D-NPT had a thickness about 60 μm.

Figure 14:
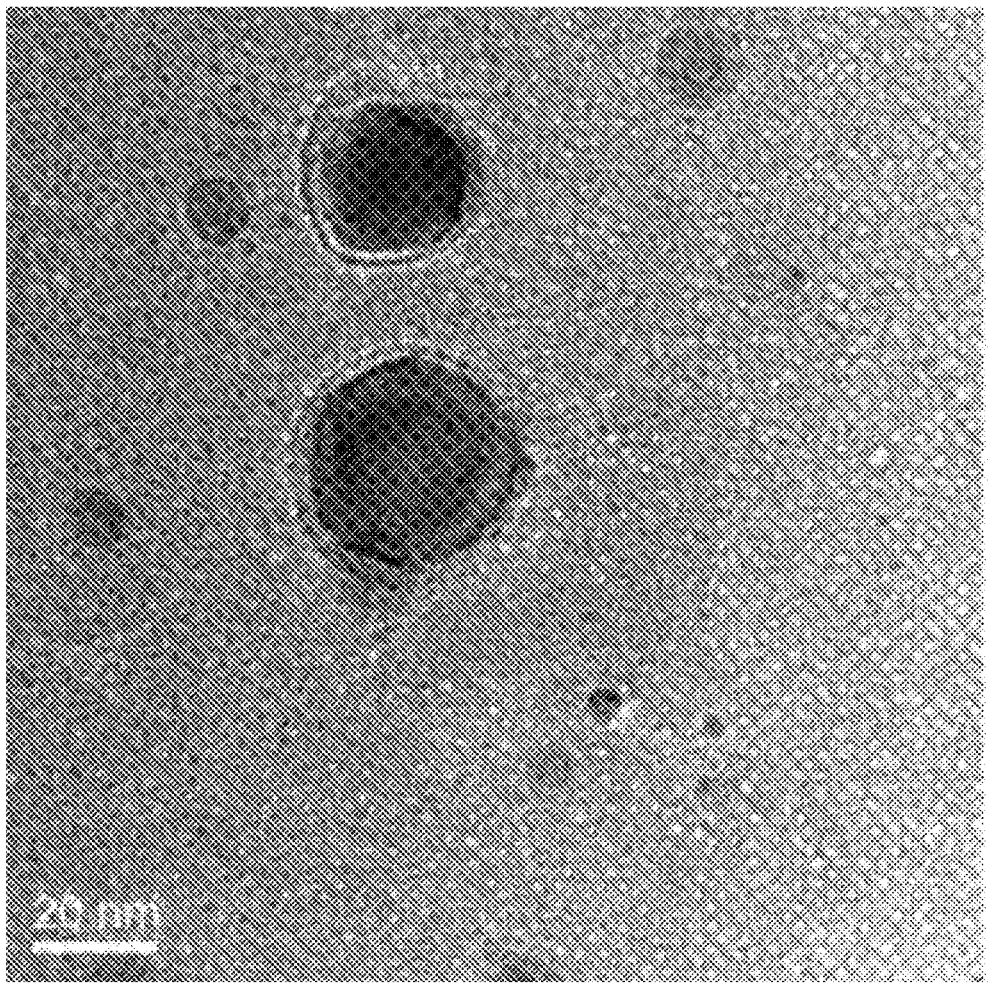
FIG. 14 is a transmission electron microscope (TEM) picture of Al/D-NPT in Example 5.

FIG. 14 is a transmission electron microscope (TEM) picture of Al/D-NPT. It can be observed in the figure that an oxide layer having a thickness of about 2 nm was disposed on the surface of the Al metal particles. This oxide layer (alumina layer) on the surface of the Al metal particles was able to protect the Al metal particles, preventing the Al metal particles from oxidation or corrosion, thereby improving the lifetime and stability of the composite material device.

Figure 10:
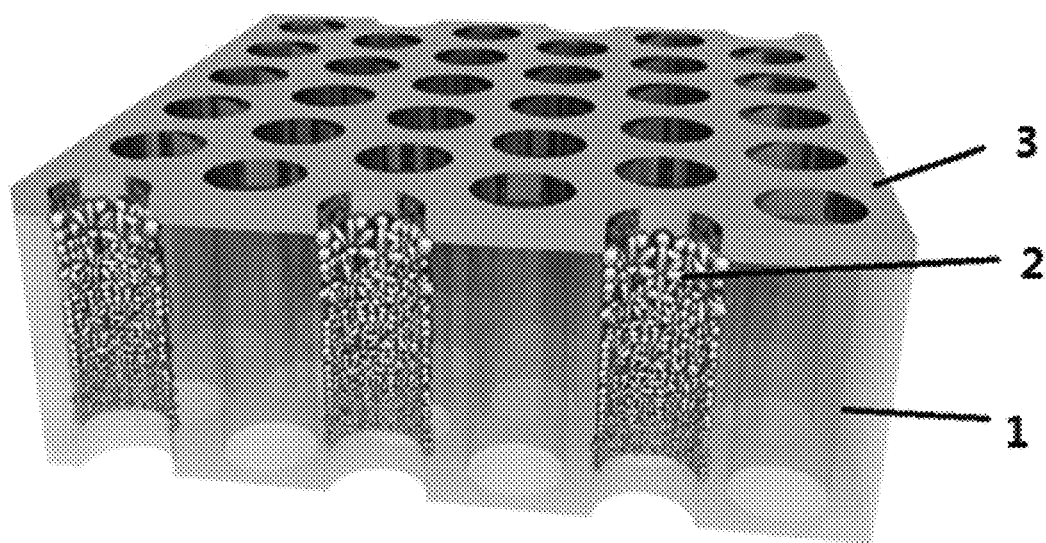
FIG. 10 is a schematic of the composite material device according to the disclosed embodiments.

FIG. 10 is a schematic of one composite material device according to the disclosed embodiments. As shown in the figure, the composite material device comprised a substrate 1, a plurality of pores disposed on the substrate, and a plurality of metal particles 2 adhered onto the inner walls of the pores. A metal layer 3 was covered on the surface of a side of the composite material device. In the figure, the morphological characteristics of the pores and metal particles were only illustrative but not actual situations.

Light absorption experiments were respectively performed on Au/NPT of Example 1, Au/D-NPT of Example 2, Al/D-NPT of Example 3 and the disordered surface of the NPT (hereafter abbreviated as D-NPT, as the comparison example), respectively.

The hemispherical reflectance of light from Au/NPT, Au/D-NPT and NPT was measured, when they were irradiated by a UV-VIS-NIR light (wavelength from 400 nm to 2.5 μm), by utilizing a Shimadzu-UV3600 (UV-VIS-NIR) spectrophotometer with an integrating sphere attachment (ISR-3100). As the irradiated light can only be integrated in the integrating sphere, in this condition, light absorbance=1−light reflectance rate.

The transmission and reflection of light from Au/NPT, Au/D-NPT and NPT were measured by using a PerkinElmer GX-Fourier transform infrared spectral meter in the middle-infrared regime (wavelength from 2.5 μm to 10 μm). The measured wavelength range was from 400 to 4000 cm$^{-1}$, and the resolution value was 4 cm$^{-1}$. In this condition, light absorbance=1−light transmission rate−light reflectance rate.

Figure 11:
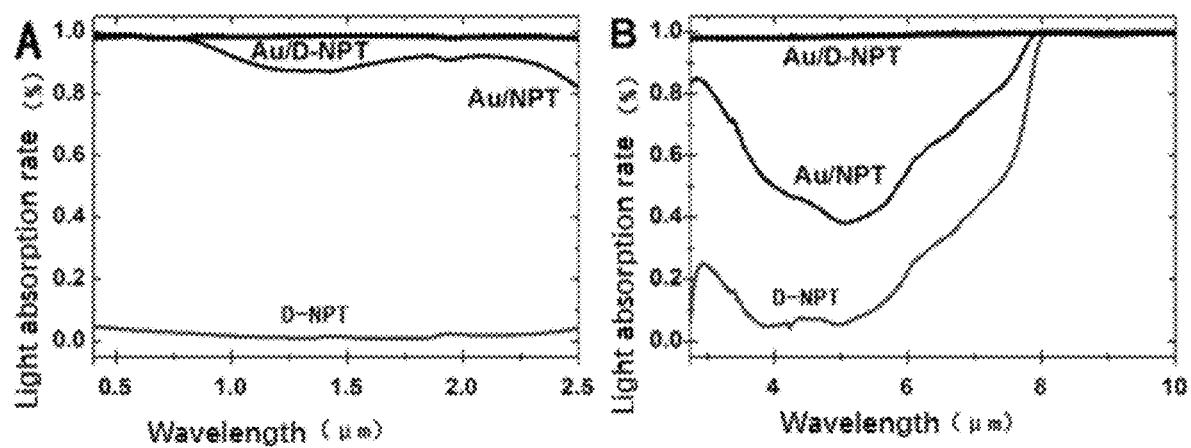
FIG. 11 shows the variation curve of the light absorbance of the Au/NPT, Au/D-NPT and D-NPT versus wavelength.

FIG. 11 was the variation curve of the measured absorbance of the Au/NPT, Au/D-NPT, and D-NPT versus wavelength in the visible near-infrared regime (400 nm to 2.5 μm) and the middle-infrared regime (2.5 μm to 10 μm).

Figure 12:
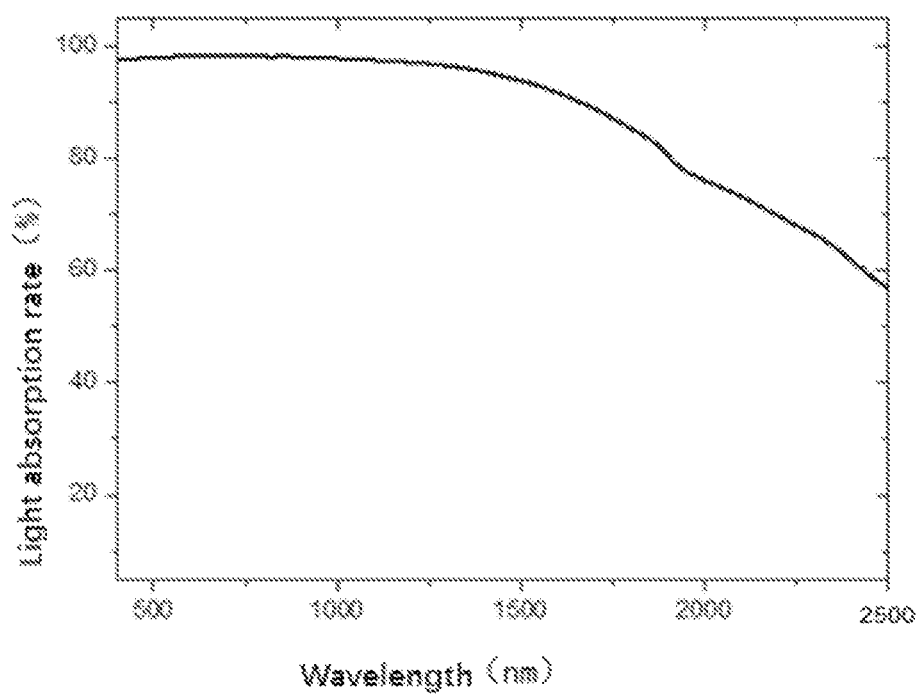
FIG. 12 shows the varication curve of the light absorbance of Al/D-NPT with wavelength.

FIG. 12 was a curve of the measured light absorbance of Al/D-NPT versus wavelength from the visible regime to the near-infrared regime (400 nm to 2.5 μm).

The average light absorbance (%) of the composite material devices of Examples 1-5 and Comparative Example D-NPT measured in a range from 400 nm to 2.5 μm and from 2.5 μm to 10 μm are shown in the following Table 4:

TABLE 4

| | | Average Absorbance (%) | |
|---|---|---|---|
| | | 400 nm-2.5 μm | 2.5 μm-10 μm |
| Example 1 | Au/NPT | 92% | 68% |
| Example 2 | Au/D-NPT | 99% | 99% |
| Example 5 | Al/D-NPT | 88% | — |
| Comparative Example | D-NPT | 5% | 22% |
| Example 3 | Au/NPT-200 | 94% | — |
| Example 4 | Au/D-NPT-8 | 90% | — |
| | Au/D-NPT-12 | 92% | — |
| | Au/D-NPT-16 | 99% | — |

Solar steam generation experiments were performed on the composite material device (Au/D-NPT) of Example 2 and the composite material device (Al/D-NPT) of Example 5.

The steam generation apparatus comprises:

(1) Illumination source: a solar simulator (Newport94043A, ClassAAA), a double-lens focusing system (200-mm focal length and 100-mm diameter for lens #1, 50-mm focal length and 30-mm diameter for lens #2; Beijing Optical Century Instrument Co.);

(2) Test chamber: a Dewar flask (Shanghai Glass Instrument Co.), inner diameter 28 mm, outer diameter 38 mm, and height 96 mm;

(3) Measurement Means: a power-meter (10 W, 19-mm-diameter detector; #1097901, Coherent), an analytic balance (FA2004, 0.1-mg accuracy), thermocouples (a highly reflective titanium oxide coating is deposited on the probes of the thermocouples by atomic layer deposition, to suppress the heating effect of direct illumination on the probes), a serial communication module (RS232), and a desktop computer.

The environmental conditions of the experiments included:

Au/D-NPT and control group using pure water: ambient temperature 24° C., humidity 42%;

Al/D-NPT and control group using pure water: ambient temperature 24° C., humidity 48%.

The experiment comprised the following steps:

(1) Water was held in the Dewar flask, and a composite material device (Au/D-NPT; Al/D-NPT) was placed on the water surface and the composite material device being in parallel with the water surface. The surface of the device on which metal particles (or metal layer) were deposited was downward to the water surface, being in contact with water surface, and partial of the composite material device was immersed in water. The porous composite material device (Au/D-NPT; Al/D-NPT) according to the disclosed embodiments could naturally float on the water surface. The porous structure having through-pores provided convenient passageways for continuously produced steam to let them emit. Further, a pure water control group was set up, in which a Dewar flask was contained with water, and no composite material device was disposed therein.

(2) The light generated form the solar simulator (Newport94043A) was filtered by an optical filter to provide standard solar irradiation in line with AM1.5G spectrum. The solar irradiation was focused by the double-lens system and then projected on the composite material device in the Dewar flask (as for the comparison experiment, the irradiation was focused and then projected on the water surface).

(3) Before the experiment started, the power density $C_{opt}P_0$, with a unit of kW·m$^{-2}$, of the irradiated light was measured and determined by using a power meter. Meanwhile, during the generation of steam, the analytic balance was used to measure the mass loss of water, thus the mass-loss rate of water, i.e., the steam generation rate by mass, with the unit kg/m²/h, could be obtained. In order to obtain a stable steam generation rate, the steam generation rate (m) according to the disclosed embodiments was determined as follows: the average steam generation rate measured at 2600 second to 3600 second from the beginning of light irradiation. In the experiment, the data was recorded by the serial communication system and the desktop computer.

In order to calculate the energy efficiency ($\eta$) of the composite device when converting solar energy to water-steam transforming, an equation was introduced here, wherein m represented the steam generate rate, $h_{LV}$ represented the liquid-vapor phase transition heat, and $C_{opt}P_0$ represented the irradiation power density on the surface of the device.

Solar steam generation experiments were performed by using Au/D-NPT of Example 2, Al/D-NPT of Example 5 according to the disclosed embodiments, and water without a composite material device, respectively. The steam generate rate (m) was measured at different irradiation power density ($C_{opt}P_0$), and the energy conversion efficiency ($\eta$) is calculated. Table 5 and Table 6 showed the steam generation rate (m) and energy conversion efficiency ($\eta$) of Au/D-NPT and pure water control group (without Au/D-NPT) at different irradiation powers densities ($C_{opt}P_0$). Table 7 and Table 8 showed the steam generation rate (m) and energy conversion efficiency ($\eta$) of Al/D-NPT and pure water control group (without Al/D-NPT) at different irradiation powers densities ($C_{opt}P_0$).

shown in Table 7, when $C_{opt}P_0$=6 kW·m⁻², the energy conversion efficiency ($\eta$) exceeded 90%.

Figure 13:
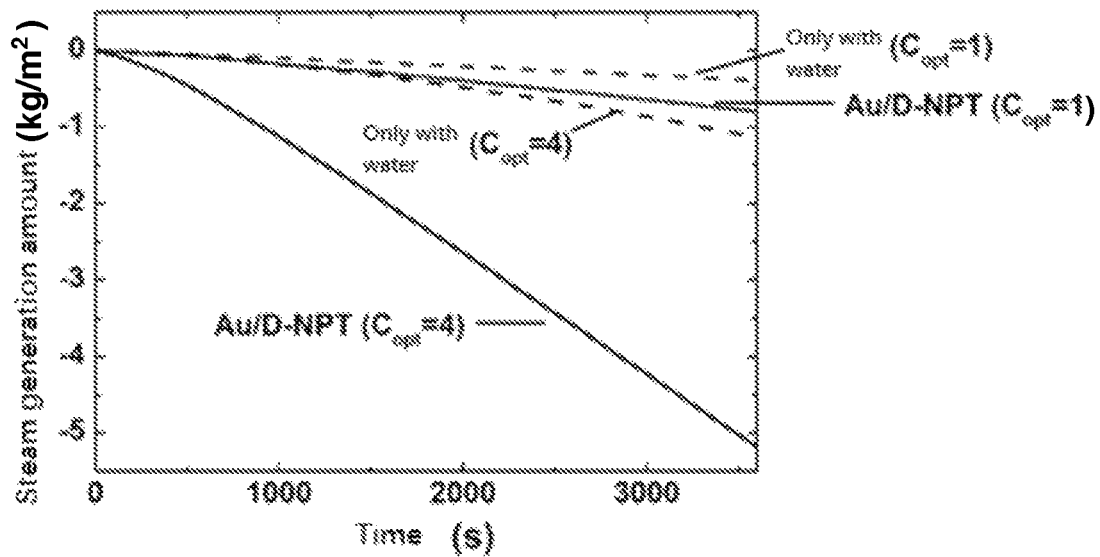
FIG. 13 shows variation curves of the steam generation quantity with time when Au/D-NPT is used and Au/D-NPT is not used.

By comparing Table 5 and Table 6, it can be found that when the composite material devices according to the disclosed embodiments were used, the steam generation rate (m) and the energy conversion efficiency ($\eta$) will be significantly increased. FIG. 13 is a curve of the steam generation quantity versus time under the conditions that Au/D-NPT was used and Au/D-NPT was not used (only water), wherein $C_{opt}$=1 represents $C_{opt}P_0$=1 kW·m⁻², and $C_{opt}$=4 represents $C_{opt}P_0$=4 kW·m⁻². As shown in FIG. 13, when $C_{opt}P_0$=1 KWm⁻² and 4 kWm⁻² respectively, the steam generation rate obtained when composite material device Au/D-NPT was used were 2.1 times or 3.6 times higher than that when Au/D-NPT was not used. The above beneficial effects were primarily owned to the broad light absorption wavelength range and high light absorbance rate of the composite material devices according to the disclosed embodiments, further may be owned to the morphological characteristics of the metal particles in the composite material devices according to the disclosed embodiments, and further may be owned to the morphological characteristics of the pores of the composite material devices according to the disclosed embodiments.

As for Al/D-NPT of Example 5, when the irradiation power density $C_{opt}P_0$=6 kW·m⁻², the variation of the water temperature (T1) in the Dewar flask and the variation of the temperature (T2) in the pores of the composite material device Al/D-NPT with time were measured. The results

TABLE 5

| | $C_{opt}P_0$ (kW · m⁻²) | | | | |
|---|---|---|---|---|---|
| | 1 | 2 | 3 | 4 | 6 |
| m (kg/m²/h) | 0.95 ± 0.04 | 2.20 ± 0.08 | 3.67 ± 0.08 | 5.60 ± 0.16 | 8.57 ± 0.21 |
| $\eta$ (%) | 63.83 ± 3.15 | 72.91 ± 3.6 | 80.17 ± 1.98 | 90.81 ± 2.7 | 92.40 ± 2.28 |

TABLE 6

| | $C_{opt}P_0$ (kW · m⁻²) | | | |
|---|---|---|---|---|
| | 1 | 2 | 3 | 4 | 6 |
| m (kg/m²/h) | 0.41 | 0.70 | 1.11 | 1.57 | 3.71 |

TABLE 7

| | $C_{opt}P_0$ (kW · m⁻²) | | | | |
|---|---|---|---|---|---|
| | 1 | 2 | 3 | 4 | 6 |
| m (kg/m²/h) | 0.92 ± 0.03 | 2.24 ± 0.18 | 3.78 ± 0.27 | 5.63 ± 0.17 | 8.69 ± 0.21 |
| $\eta$ (%) | 57.59 ± 1.89 | 70.34 ± 5.76 | 79.00 ± 5.65 | 88.37 ± 2.69 | 90.97 ± 2.16 |

TABLE 8

| | $C_{opt}P_0$ (kW · m⁻²) | | | |
|---|---|---|---|---|
| | 1 | 2 | 3 | 4 | 6 |
| m (kg/m²/h) | 0.33 | 0.63 | 1.71 | 2.36 | 5.27 |

As shown in Table 5, for Au/D-NPT, when $C_{opt}P_0$=4 kW·m⁻² and 6 kW·m⁻², the energy efficiency ($\eta$) of the solar energy for converting water to steam exceeded 90%. As were shown in the following Table 9. The results demonstrate that when the irradiation power density of the composite material devices according to the disclosed embodiments was 6 kW·m⁻², it only took 50 minutes to raise the temperature (T2) to over 100° C. This showed that the temperature of the composite material devices according to the disclosed embodiments can be rapidly increased, and high temperature steam could therefore be produced.

TABLE 9

| | Time (minute) | | | | | | | | |
|---|---|---|---|---|---|---|---|---|---|
| | 0 | 5 | 10 | 15 | 20 | 30 | 40 | 50 | 60 |
| T1 (° C.) | 22.2 | 68.0 | 80.3 | 84.8 | 88.7 | 94.9 | 97.8 | 100.9 | 103.1 |
| T2 (° C.) | 22.2 | 25.7 | 27 | 28.4 | 30.1 | 33.8 | 38.1 | 42.7 | 47.4 |

As for Al/D-NPT of Example 5, its cycle performance was detected at different irradiation powers densities, and the specific detection steps were as follows: according to the order of the irradiation powers 1-2-3-4-6-1 kW·m$^{-2}$, the irradiation cycle experiment was performed on Al/D-NPT, and at each irradiation powers, the cycle was conducted four times. One cycle meant that Al/D-NPT was irradiated for 1 hours, and then rested for 20 minutes without light irritation. The average steam generation rate (m) of each cycle was shown in Table 10.

TABLE 10

| Cycle number | $C_{opt}P_0$ (kW·m$^{-2}$) | m (kg/m$^2$/h) |
|---|---|---|
| 1 | 1 | 0.91 |
| 2 | 1 | 0.88 |
| 3 | 1 | 0.95 |
| 4 | 1 | 0.92 |
| 5 | 2 | 2.47 |
| 6 | 2 | 2.06 |
| 7 | 2 | 2.30 |
| 8 | 2 | 2.13 |
| 9 | 3 | 4.01 |
| 10 | 3 | 3.97 |
| 11 | 3 | 3.43 |
| 12 | 3 | 3.69 |
| 13 | 4 | 5.45 |
| 14 | 4 | 5.81 |
| 15 | 4 | 5.52 |
| 16 | 4 | 5.74 |
| 17 | 6 | 8.97 |
| 18 | 6 | 8.54 |
| 19 | 6 | 8.54 |
| 20 | 6 | 8.72 |
| 21 | 1 | 0.77 |
| 22 | 1 | 0.89 |
| 23 | 1 | 0.89 |
| 24 | 1 | 0.92 |

Further, under the conditions that the irradiation power density was 2 kW·m$^{-2}$ and 4 kW·m$^{-2}$ respectively, the cycling stability of the composite material device Al/D-NPT according to the disclosed embodiments was detected. 25 cycles were conducted. One cycle meant that Al/D-NPT was irradiated for 1 hour, and then rest for 20 minutes without light irritation. The steam generation rate (m) results of each cycle, measured at an irradiation power density of 2 kW·m$^{-2}$ and 4 kW·m$^{-2}$ respectively, were shown in Table 11 and Table 12.

TABLE 11

2 kW · m$^{-2}$

| Cycle number | m (kg/m$^2$/h) |
|---|---|
| 1 | 2.44 |
| 2 | 2.06 |
| 3 | 2.20 |
| 4 | 2.13 |
| 5 | 1.76 |
| 6 | 1.85 |
| 7 | 2.44 |
| 8 | 2.05 |
| 9 | 2.15 |
| 10 | 1.85 |
| 11 | 1.95 |
| 12 | 1.95 |
| 13 | 2.15 |
| 14 | 2.34 |
| 15 | 2.44 |
| 16 | 2.15 |
| 17 | 2.15 |
| 18 | 2.02 |
| 19 | 2.11 |
| 20 | 2.51 |
| 21 | 1.85 |
| 22 | 2.24 |
| 23 | 2.04 |

TABLE 12

4 kW · m$^{-2}$

| Cycle number | m (kg/m$^2$/h) | Cycle number | m (kg/m$^2$/h) |
|---|---|---|---|
| 5 | 5.81 | 21 | 5.30 |
| 6 | 5.45 | 22 | 4.96 |
| 7 | 5.52 | 23 | 4.95 |
| 5 | 5.81 | 24 | 4.83 |
| 8 | 5.73 | 25 | 5.04 |

As shown in Table 10, Table 11 and Table 12, the composite material devices according to the disclosed embodiments had excellent cycling stability and thermal stability. they had steady output and at different irradiation powers. After 25 cycles, the steam generation rate m (kg/m$^2$/h) were substantially stable, without any attenuation.

A sea water desalination experiment was conducted on the composite material device Al/D-NPT according to the disclosed embodiments. The experiment were conducted as follows: four NaCl aqueous solutions with different concentrations were prepared with NaCl, and were numbered with 1 to 4. The composite material device (Al/D-NPT) according to the disclosed embodiments was used to evaporate the above NaCl aqueous solutions at an irradiation power density $C_{opt}P_0$ from 1.75 to 1.91 kW·m$^{-2}$. The steam evaporated from the solutions were condensed and collected, thus desalinized water was obtained. The NaCl concentrations (C1 mg/L) of the NaCl aqueous solutions and the NaCl concentrations (C2 mg/L) of the desalinized water after and before the desalination experiment were shown in the following Table 13.

TABLE 13

| Serial number | 1/Baltic sea | 2/Global | 3/Red Sea | 4/Dead Sea |
|---|---|---|---|---|
| C1 (mg/L) | 8000 | 35000 | 40000 | 93600 |
| C2 (mg/L) | 0.86 | 0.27 | 0.42 | 0.25 |

Seawater from the Bohai sea in China was evaporated by using the composite material device (Al/D-NPT) according to the disclosed embodiments, and the variations of the concentrations of Na$^+$, Mg$^{2+}$, Ca$^{2+}$, K$^+$ and B$^{3+}$ before and after the desalination were investigated, and the results were shown in Table 14.

TABLE 14

| Serial number | Na$^+$ | Mg$^{2+}$ | Ca$^{2+}$ | K$^+$ | B$^{3+}$ |
|---|---|---|---|---|---|
| Before desalination (mg/L) | 8089 | 1314 | 410 | 530 | 4.18 |
| After desalination (mg/L) | 0.34 | 0.0105 | 0.23 | 0.11 | 0.0105 |

As shown in Table 13 and Table 14, the composite material devices according to the disclosed embodiments can desalinize sea water by utilizing light energy, effectively reducing the concentrations of one or more of $Na^+$, $Mg^{2+}$, $Ca^{2+}$, $K^+$ and $B^{3+}$ in seawater.

Finally, it should be made clear that: the above examples are only used for interpreting the technical solution of the disclosed but not for restriction; although bye referring to the optimum examples, the disclosed is described in detail, a person skilled in the art should understand that modifications to the specific embodiments of the disclosed and equivalent substitutions to a part of the technical features therein are still allowable; with deviation from the spirit of the disclosed, the above modifications and substitutions should fall into the scope of the technical solution as claimed in the disclosed.

The invention claimed is:

1. A composite material device, comprising:
    a substrate comprising a plurality of pores, wherein said substrate is a porous anodic alumina; and
    a plurality of gold particles adhered onto the inner walls of said pores,
    wherein:
        said gold particles have a distributing density of from about $10^2$ to about $10^4$ particles/$\mu m^2$ on the inner walls of the pores, said gold particles have a particle size of from 1 to 200 nm, and said plurality of gold particles have at least 10 different particle sizes d;
        the 10 different particle sizes d are selected from the group consisting of $d_1$ to $d_{10}$: 1 nm≤$d_1$<10 nm, 10 nm≤$d_2$<20 nm, 20 nm≤$d_3$<30 nm, 30 nm≤$d_4$<40 nm, 40 nm≤$d_5$<50 nm, 50 nm≤$d_6$<60 nm, 60 nm≤$d_7$<70 nm, 70 nm≤$d_8$≤80 nm, 80 nm≤$d_9$≤90 nm, 90 nm≤$d_{10}$≤100 nm;
    said plurality of pores have at least 5 different pore diameters f, said 5 different pore diameters f selected from the group consisting of $f_9$ to $f_{13}$: 160 nm≤$f_9$<200 nm, 200 nm≤$f_{10}$<250 nm, 250 nm≤$f_{11}$<300 nm, 300 nm≤$f_{12}$<350 nm, 350 nm≤$f_{13}$<380 nm;
    said pores have 6 shapes selected from: triangle, quadrilateral, pentagons, hexagons, circle, and ellipse;
    said pores have an average pore diameter of from 300 to 400 nm;
    said substrate has a porosity of from 40% to 70% on at least one surface of the substrate; and
    said composite material device has an average light absorption rate of greater than 85% at wavelengths ranging from 400 nm to 2.5 $\mu m$.

2. The composite material device of claim 1, wherein said gold particles have a particle size of from 1 to 150 nm.

3. The composite material device of claim 1, wherein at least one of the following is satisfied:
    1) said gold particles have an aspect ratio of from 1 to 10;
    2) said plurality of gold particles have at least y aspect ratios e, y being greater than or equal to 2;
    3) said gold particles have one, two or three shapes selected from: rod, ellipse and sphere;
    4) the gold particles are disposed such that the distance between the adjacent gold particles is from 1 to 50 nm;
    5) the gold particles have a distributing density of from about $10^3$ to about $10^4$ particles/$\mu m^2$;
    6) the gold particles are disposed at a position from g to h $\mu m$ in depth from a surface of a side of the substrate to the interior of the substrate along a length of the surface of the inner walls of said pores, g<h; g≥0, h≥0;
    7) said gold particles have a size gradient from one side to the other side of the substrate;
    8) said gold particles have an aspect ratio gradient from one side to the other side of the substrate;
    9) said gold particles have shapes varying from one side to the other side of the substrate; and
    10) said plurality of gold particles are disorderedly distributed on the inner walls of said pores.

4. The composite material device of claim 1, wherein at least one of the following is satisfied:
    1) said pores have an average pore diameter of from 200 to 1000 nm;
    2) said pores have aspect ratios ranging from 1 to 3;
    3) said pores have an average pore-to-pore distance between adjacent pores of from 300 to 600 nm;
    4) said pores are distributed disorderly on a surface of the substrate;
    5) said pores have straight or curve pore channels;
    6) said pores have pore channels at an angle of 90 degrees relative to a surface of the substrate, or said pores have pore channels at an angle other than 90 degrees relative to a surface of the substrate;
    7) said pores are through pores or non-through pores;
    8) said composite material device have a shape of a planar plate or a curved plate;
    9) said composite material device has a total thickness from 20 to 200 $\mu m$; and
    10) the substrate is covered with a metal layer on a surface of a side thereof to which said gold particles are adjacent.

5. The composite material device of claim 4, wherein at least one of the following is satisfied:
    1) said metal layer only covers the regions of the surface without pores;
    2) said metal layer has a total thickness from 50 to 100 nm;
    3) said pores are non-through pores, and said metal layer only covers the regions of the surface without pores;
    4) said pores are through pores, and the metal layer is deposited on a surface of a side to which the gold particles are adjacent; and
    5) said metal layer is made of a metal selected from the group consisting of: noble metals, transition metals or light metals.

6. The composite material device of claim 1, wherein at least one of the following is satisfied:
    1) said substrate is made by an anodization method; and
    2) said gold particles are made by a physical vapor deposition process.

7. The composite material device of claim 6, wherein said physical vapor deposition process is an ion beam sputtering process or an electron beam evaporation process.

8. The composite material device of claim 7, wherein at least one of the following is satisfied:
    1) said ion beam sputtering process is performed under one or more conditions of (i) to (iv):
        (i) a vacuum degree of from $4 \times 10^{-4}$ to $6 \times 10^{-4}$ Pa;
        (ii) an ion gun voltage of from 6 to 8 keV;
        (iii) an ion current of from 200 to 400 $\mu A$; and
        (iv) a sputtering time of from 5 to 20 minutes; and
    2) said electron beam evaporation is performed under one or more conditions of (i') to (ii'):
        (i') a vacuum degree of from $4 \times 10^{-4}$ to $6 \times 10^{-4}$ Pa; and
        (ii') a film-plating rate of 1 Å/s.

9. The composite material device of claim 1, wherein at least one of the following is satisfied:
    1) said composite material device has an average light absorption rate of higher than 95% at wavelengths ranging from 400 nm to 2.5 $\mu m$;

2) said composite material device is capable of absorbing light having a wavelength ranging from 1 nm to 50 μm;
3) said composite material device can convert liquid water to steam by utilizing light when it is under light irradiation;
4) said gold particles have a material capable of improving the performances of said gold particles disposed thereon; and
5) when a Fourier transform is performed on a scanning electron microscope photo of a surface of a side of the substrate to which said gold particles are adjacent, a Fourier transform picture showing a ring having an outer to inner diameter ratio of 2 or above is obtained.

10. The composite material device of claim 9, wherein at least one of the following is satisfied:
1) said material capable of improving the performances of said gold particles can improve the antioxidant property and/or corrosion resistance of said gold particles;
2) said material capable of improving the performances of said gold particles is an antioxidant material and/or a corrosion resistant material;
3) said material capable of improving the performances of said gold particles includes metallic materials, inorganic non-metallic materials and/or organics;
4) said material capable of improving the performances of said gold particles includes oxides; and
5) said material capable of improving the performances of said gold particles has a composition which is different from that of said gold particles.

11. The composite material device of claim 1, wherein the gold particles have a distributing density of from about $10^3$ to about $10^4$ particles/μm² on the inner walls of the pores.

12. The composite material device of claim 1, wherein the gold particles are disposed at a position from g to h μm in depth from a surface of a side of the substrate to the interior of the substrate along a length of the surface of the inner walls of said pores, g=0, h>2, said composite material device having a total thickness from 50 to 100 μm.

13. A method for producing the composite material device of claim 1, comprising depositing metal particles on a surface of a substrate comprising a plurality of pores and on the inner walls of said pores by a physical vapor deposition process.

14. The method of claim 13, wherein said physical vapor deposition process is an ion beam sputtering process.

15. The method of claim 14, wherein said ion beam sputtering process is performed under one or more conditions of (i) to (iv):
(i) a vacuum degree of from $4\times10^{-4}$ to $6\times10^{-4}$ Pa;
(ii) an ion gun voltage of from 6 to 8 keV;
(iii) an ion current of from 200 to 400 μA; and
(iv) a sputtering time of from 5 to 20 minutes.

16. The method of claim 13, wherein said physical vapor deposition method is an electron beam evaporation.

17. The method of claim 16, wherein said electron beam evaporation is performed under one or more conditions (i) to (ii):
(i) a vacuum degree of from $4\times10^{-4}$ to $6\times10^{-4}$ Pa; and
(ii) a film-plating rate of 1 Å/s.

18. The method of claim 13 further comprising applying a material capable of improving the performances of said metal particles thereon.

19. A method for absorbing light, wherein the composite material device of claim 1 is subjected to light irradiation.

20. The method of claim 19, wherein the composite material device converts light into heat.

21. The method of claim 19, wherein the composite material device desalinates seawater.

* * * * *